US006395607B1

(12) United States Patent
Chung

(10) Patent No.: US 6,395,607 B1
(45) Date of Patent: May 28, 2002

(54) INTEGRATED CIRCUIT FABRICATION METHOD FOR SELF-ALIGNED COPPER DIFFUSION BARRIER

(75) Inventor: Henry Chung, Cupertino, CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/328,647

(22) Filed: Jun. 9, 1999

(51) Int. Cl.[7] .............................................. H01L 21/331
(52) U.S. Cl. ...................... 438/312; 438/314; 438/316; 438/687; 257/751; 257/752
(58) Field of Search ................. 438/637–641, 438/672–676, 312–316

(56) References Cited

U.S. PATENT DOCUMENTS

| 5,262,354 A | | 11/1993 | Cote et al. | |
|---|---|---|---|---|
| 5,527,739 A | * | 6/1996 | Parrillo et al. | 438/672 |
| 5,592,024 A | | 1/1997 | Aoyama et al. | 257/751 |
| 5,801,095 A | | 9/1998 | Yew et al. | 438/624 |
| 6,069,068 A | | 5/2000 | Rathore et al. | 438/628 |
| 6,110,648 A | * | 8/2000 | Jang | 430/312 |

* cited by examiner

Primary Examiner—David Nelms
Assistant Examiner—Dung A Le
(74) Attorney, Agent, or Firm—Roberts & Mercanti, LLP

(57) ABSTRACT

A microelectronic device having a self aligned metal diffusion barrier is disclosed. A microelectronic device having a substrate and a dielectric layer on the substrate. A trench having inside walls is formed through the dielectric layer. A lining of a barrier metal is on the inside walls of the trench and a fill metal is in the trench between the linings on the inside walls of the trench. The fill metal and the barrier metal have substantially different removal selectivities. A covering of the barrier metal is on the fill metal and the covering spans the linings on the inside walls of the trench and conforms to the top of the fill metal in the trench.

13 Claims, 4 Drawing Sheets

INTEGRATED CIRCUIT FABRICATION METHOD FOR SELF-ALIGNED COPPER DIFFUSION BARRIER

BACKGROUND OF THE INVENTION

1. Field of the Invention

The present invention relates to the formation of microelectronic devices such as integrated circuit structures. More particularly, the invention relates to microelectronic devices having a self aligned metal diffusion barrier.

2. Description of the Related Art

The production of microelectronic devices requires multilevel wiring interconnects regions within the devices. In forming such structures, it is conventional to provide a substrate having first level wiring lines, an interlayer dielectric (ILD) and then second level wiring lines. One or more interconnections are typically formed between the first and second level wiring lines. Openings are formed in the dielectric layer which are filled with a metal to form a metal plug interconnect. After the two level interconnect structure is formed, it is necessary to provide another interlevel dielectric (ILD) layer to accommodate further processing of the integrated circuit device. The intermetal dielectric layer usually consists of a layer of a dielectric and an oxide such as silicon oxide which is deposited by plasma enhanced chemical vapor deposition or other processes. When the damascene approach is taken for forming integrated circuits with copper interconnections, the conventional fabrication method requires a layer of silicon nitride film on top of the copper interconnection to prevent upward copper diffusion into the ILD. However, the use of silicon nitride has two major disadvantages. It has a high dielectric constant and thus degrades speed and performance resulting from increased in-line and inter-level capacitance. This speed degradation becomes unacceptable for integrated circuits fabricated using 0.18 µm and more advanced technologies. Silicon nitride acts a copper diffusion barrier over the copper interconnects, however its use involves other problems. Part of the silicon nitride over the copper interconnects has to be removed during via etch so that a conductive path can be established between two neighboring interconnect levels through vias. Anisotropic plasma etch is usually used for opening vias. The common practice is performing an over-etch in the vias to assure that the underlying copper is fully exposed. During this over-etch, some of the copper is backsputtered and deposited on via sidewalls or re-deposited on the copper interconnects. During sputter etching, deposition of back-sputtered copper on via sidewalls takes place. Copper deposited on via sidewalls can readily diffuse through the ILD and eventually results in an electrical short between two adjacent interconnects thus causing major reliability problems. The causes of these problems is the use of silicon nitride, a dielectric, as a diffusion barrier as well as the simultaneous exposure of copper and the ILD during plasma etches or sputter etches. According to the invention, these problems are solved by use of a conductive, i.e. a metallic diffusion barrier instead of silicon nitride. The same metal barrier as is commonly used on the sides and at the bottom of a copper interconnect may be deposited on top of the copper interconnect.

SUMMARY OF THE INVENTION

The invention provides a process for forming a microelectronic device which comprises:

(a) forming a first dielectric layer on a substrate;

(b) forming a trench having inside walls through the first dielectric layer;

(c) lining the inside walls of the trench and covering a top of the first dielectric layer with a first layer of a barrier metal;

(d) filling the trench with a fill metal and covering the top of the first layer of the barrier metal with a layer of the fill metal, wherein the fill metal and the barrier metal have substantially different removal selectivities;

(e) removing the layer of the fill metal from the top of the first layer of the barrier metal and forming a recess in the fill metal in the trench extending to a level below the top of the first layer of the barrier metal on the first dielectric layer;

(f) filling the recess with the barrier metal and optionally depositing a second layer of the barrier metal onto the top of the first layer of barrier metal;

(g) removing the optional second layer of barrier metal from the top of the first dielectric layer and leaving the barrier metal in the recess such that the barrier metal in the recess conforms to the top of the underlying fill metal in the trench;

(h) depositing a second dielectric layer onto the first dielectric layer and onto the barrier metal in the recess.

The invention also provides a microelectronic device comprising a substrate, a dielectric layer on the substrate; a trench having inside walls through the dielectric layer; a lining of a barrier metal on the inside walls of the trench; a fill metal in the trench between the linings on the inside walls of the trench, wherein the fill metal and the barrier metal have substantially different removal selectivities; a covering of the barrier metal on the fill metal, which covering spans the linings on the inside walls of the trench and conforms to the top of the fill metal in the trench.

DETAILED DESCRIPTION OF THE PREFERRED EMBODIMENT

Figure 1:
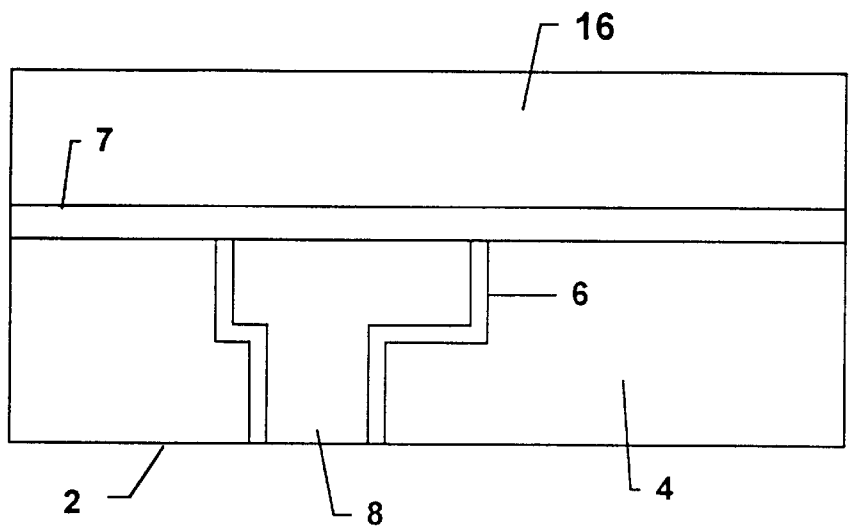
FIG. 1 shows a prior art microelectronic device showing a lower interlevel dielectric (ILD), a metal barrier layer, a copper filled interconnect and a silicon nitride layer on the copper interconnect.
Figure 2:
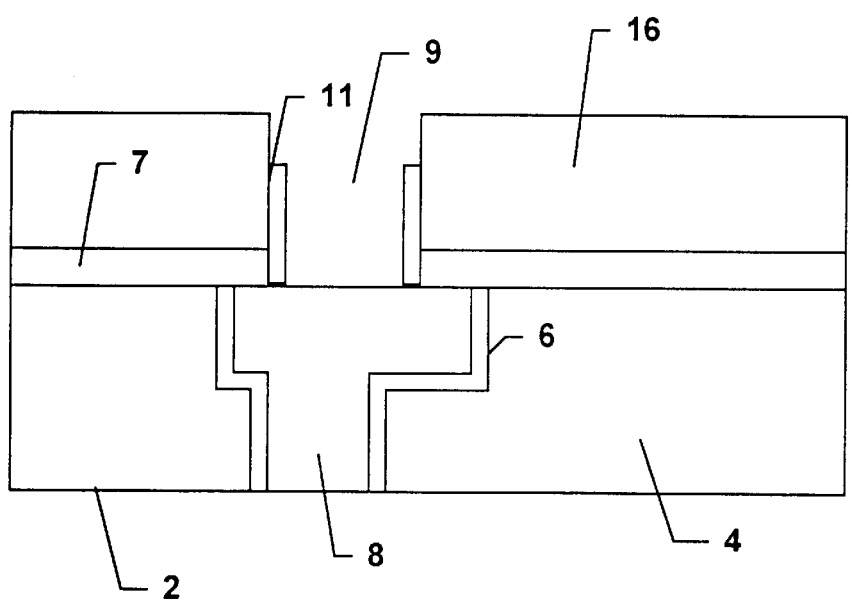
FIG. 2 shows a prior art microelectronic device showing a via cut in a silicon nitride layer with copper is backsputtered and deposited on via sidewalls.

According to the prior art, a first interlayer dielectric 4 is formed on a substrate 2 as shown in FIG. 1. A trench is then cut in the first dielectric. The trench is then lined with a barrier metal 6 and the balance of the trench filled with a fill metal 8, which is usually copper. The barrier metal prevents the copper from migrating into the first dielectric layer. The top of the copper and the first dielectric layer is then deposited with a silicon nitride diffusion barrier 7 which is then covered with a second interlayer dielectric 16. The silicon nitride prevents penetration of the copper fill into the second dielectric layer. As a next step in prior art processing as shown in FIG. 2, a via 9 is etched through the second dielectric layer and through the silicon nitride until the copper filled trench is reached. This etching causes the copper to be backsputtered and deposited on via sidewalls at 11 as shown.

Figure 3:
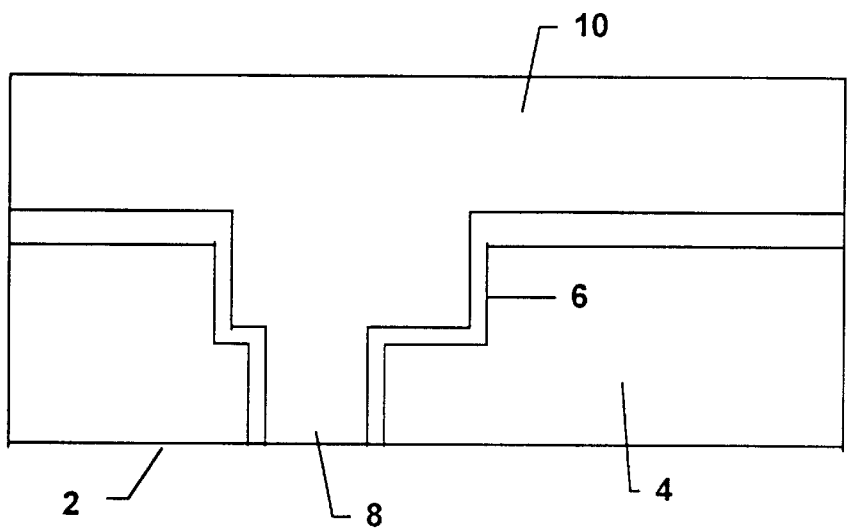
FIG. 3 shows a portion of a microelectronic device having an interlevel dielectric, a barrier metal deposited on the ILD and copper on the barrier metal.
Figure 4:
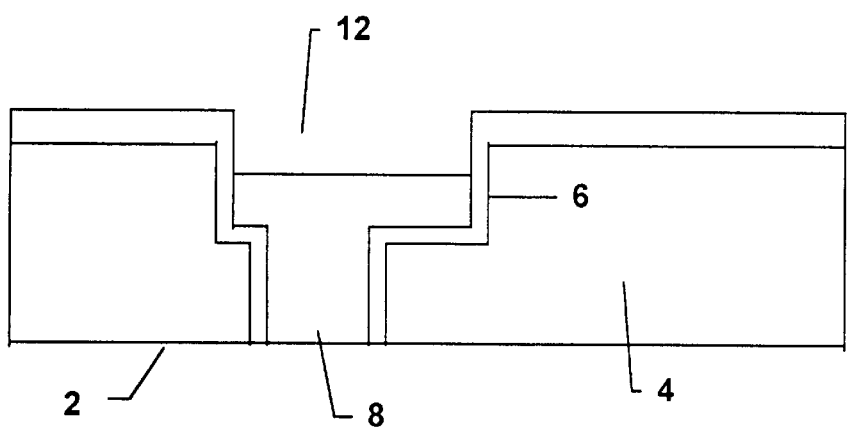
FIG. 4 shows a portion of a microelectronic device having an interlevel dielectric, a barrier metal deposited on the ILD and a copper with copper removed from the top of the ILD and a recess in the copper interconnect.

According to the first step of the invention as shown in FIG. 3, a first interlayer dielectric 4 is deposited onto a substrate 2. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The dielectric composition may comprise any of a wide variety of dielectric forming materials which are well known in the art for use in the formation of microelectronic devices. The dielectric layer may nonexclusively include silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica or mixtures thereof.

One useful polymeric dielectric materials useful for the invention include an nanoporous silica alkoxysilane polymer formed from an alkoxysilane monomer which has the formula:

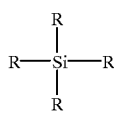

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference.

Preferred siloxane materials suitable for use in this invention are commercially available from AlliedSignal Inc. under the tradename Accuglass® T-11, T-12 and T-14. Also useful are methylated siloxane polymers available from AlliedSignal Inc. under the tradenames Purespin™ and Accuspin® T18, T23 and T24.

Preferred silicon containing dielectric resins include polymers having a formula selected from the group consisting of $[(HSiO_{1.5})_xO_y]_n,(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

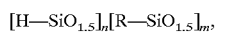

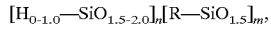

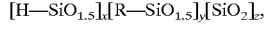

wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain low organic content silicon containing polymers such as those having the formula II:

$[HSiO_{1.5}]_n[RSiO_{1.5}]_m$, $[H_{0.4-1.0}SiO_{1.5-1.8}]_n[R_{0.4-1.0}SiO_{1.5-1.8}]_m$, $[H_{0-1.0}SiO_{1.5-2.0}]_n[RSiO_{1.5}]_m$, wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof.

Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm$^3$ to about 3 g/cm$^3$.

The dielectric layer may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The polymer layer may also optionally be exposed to actinic light, such as UV light, to increase its molecular weight. The amount of exposure may range from about 100 mJ/cm$^2$ to about 300 mJ/cm$^2$.

The dielectric layer 4 may optionally be overall exposed to electron beam radiation to cure the dielectric. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 μC/cm$^2$ and more preferably from about 50 to about 20,000 μC/cm$^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Trenches are then formed in the dielectric layer by well known photolithographic techniques using a photoresist composition. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the dielectric surface and the inside walls of the vias by plasma etching. Plasma generators which are capable of are described in U.S. Pat. Nos. 5,174,856 and 5,200,031.

Next the trenches and the top of the first interlayer dielectric are lined with a barrier metal 6 which serves to separate the dielectric from a fill metal which is to be deposited into the lined trenches. Suitable barrier metals include titanium, titanium nitride, tantalum and tantalum nitride. Such may be applied by well known sputtering, evaporation, electroplating or vapor deposition techniques.

Next the lined trenches 6 are filled with a conductive metal which fills the trenches 8 and also forms a layer top 10 on top of the hardened dielectric 4 as shown in FIG. 3. Suitable fill metals include aluminum, aluminum alloys, copper, copper alloys, tantalum, tungsten, titanium or other metal typically employed in the formation of microelectronic devices. However, copper is most preferred. The metal may be applied by such techniques as vapor deposition, sputtering, evaporation and the like. An important criteria for the selection of the fill and barrier metals is that they have significantly different removal selectivity characteristics. That is, a process step which removed the barrier layer does not remove the fill metal and vice versa.

Figure 5:
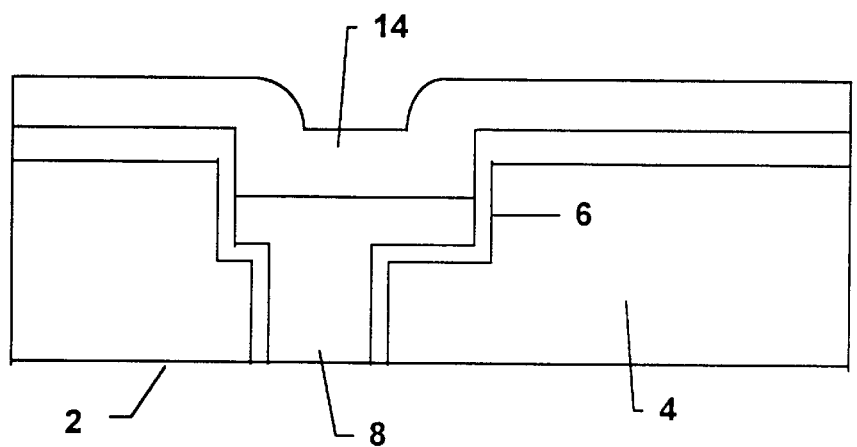
FIG. 5 shows a portion of a microelectronic device of FIG. 4 after a barrier metal has been deposited on the ILD and the copper interconnect.

Then the fill metal is removed from the top of the dielectric and a recess 12 is formed in the uppermost portion of the fill metal. The recess can be produced in different ways such as by proper combinations of chemical-mechanical polishing (CMP), plasma etch, wet etch and electropolishing. One way is to modify the CMP process so that the fill metal is over-polished and, thus, additional fill metal is removed. Another approach is to do plasma etch, wet etch or electropolishing following a conventional CMP step. The key requirement here is that the removal of fill metal needs have a high fill metal-to-barrier metal selectivity. Now another layer of the barrier metal is deposited over the first barrier layer 6 and the barrier metal fills the recess 12 as well to form a filled recess 14 as shown in FIG. 5. The barrier metal is deposited in a like manner as done above.

Figure 6:
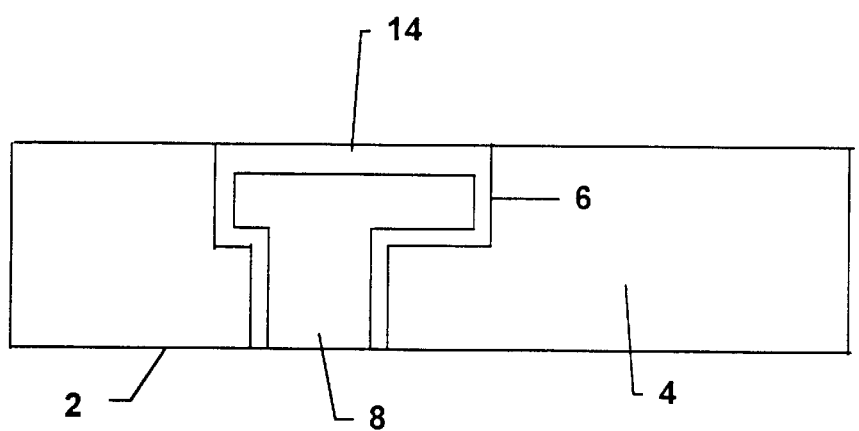
FIG. 6 shows a microelectronic device after the barrier metal has been removed from the top of the ILD.
Figure 7:
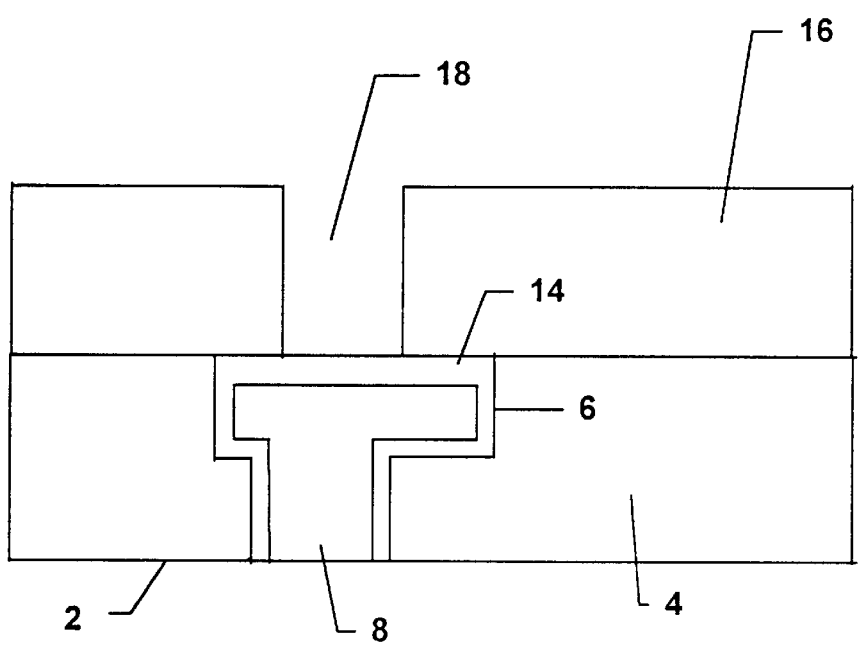
FIG. 7 shows a shows the microelectronic device of FIG. 6 after a via has been cut in the ILD over the barrier metal on the copper interconnect.

Next the barrier metal layer is removed from the first interlayer dielectric 4 by chemical-mechanical polishing (CMP), plasma etch, wet etch or electropolishing to produce the structure shown in FIG. 6. It may be noticed that the copper fill metal 8 is now completely encapsulated by the barrier metal, and the need for a silicon nitride layer has thereby been eliminated. The barrier metal in turn is within the first interlayer dielectric 4 on all sides except the top. The structure of FIG. 6 is the applied with another second interlayer dielectric 16 of any of the dielectrics materials mentioned above as seen in FIG. 7. Vias 18 may now be cut into the upper second dielectric layer by lithographic and etching techniques. It is to be noted in FIG. 7 that the vias are clean, i.e. no copper is backsplattered onto via walls. In addition, since the barrier metal in the recess 14 is conductive, an electrical connection to the copper 8 has now been made possible therethrough. The use of a metallic barrier does not significantly increase capacitance. Such was not heretofore possible with the dielectric silicon nitride. As is shown in FIG. 7 that the implementation of this invention also resolves the issue of Cu deposition on via sidewall since the Cu is capped with barrier metal during plasma etches and sputter etches. The additional advantage of this invention is that the cap barrier metal is fully self-aligned to the underlying Cu interconnection. The vias may now be filled with a metal by similar techniques as mentioned above. It is to be understood that these steps may be repeated to provide a series of suitable layers and conductive paths over one another on the substrate.

What is claimed is:

1. A process for forming a microelectronic device which comprises:

(a) forming a first dielectric layer on a substrate;

(b) forming a trench having inside walls through the first dielectric layer;

(c) lining the inside walls of the trench and covering a top of the first dielectric layer with a first layer of a barrier metal;

(d) filling the trench with a fill metal and covering the top of the first layer of the barrier metal with a layer of the fill metal, wherein the fill metal and the barrier metal have substantially different removal selectivities;

(e) removing the layer of the fill metal from the top of the first layer of the barrier metal and forming a recess in the fill metal in the trench extending to a level below the top of the first layer of the barrier metal on the first dielectric layer;

(f) filling the recess with the barrier metal and optionally depositing a second layer of the barrier metal onto the top of the first layer of barrier metal;

(g) removing the optional second layer of barrier metal from the top of the first dielectric layer and leaving the barrier metal in the recess such that the barrier metal in the recess conforms to the top of the underlying fill metal in the trench;

(h) depositing a second dielectric layer onto the first dielectric layer and onto the barrier metal in the recess.

2. The process of claim 1 wherein the first dielectric layer comprises a silicon containing polymer, an alkoxysilane polymer, a silsesquioxane polymer, a siloxane polymer, a poly(arylene ether), a fluorinated poly(arylene ether), a nanoporous silica or combinations thereof.

3. The process of claim 1 wherein the substrate comprises a semiconductor or insulating material.

4. The process of claim 1 wherein the substrate comprises gallium arsenide, germanium, silicon, silicon germanium, lithium niobate and compositions containing silicon or combinations thereof.

5. The process of claim 1 wherein the fill metal comprises copper.

6. The process of claim 1 wherein the barrier metal comprises a material selected from the group consisting of titanium, titanium nitride, tantalum and tantalum nitride.

7. The process of claim 1 wherein the removing of the fill metal is conducted by one or more processes selected from the group consisting of chemical mechanical polishing, plasma etching, wet etching and electropolishing.

8. The microelectronic device produced according to the process of claim 1.

9. The process of claim 1 further comprising
   (i) forming a via through the second dielectric layer extending to the barrier metal in the recess and filling the via with a metal.

10. The process of claim 9 wherein the fill metal comprises copper.

11. The process of claim 9 wherein the barrier metal comprises a material selected from the group consisting of titanium, titanium nitride, tantalum and tantalum nitride.

12. The process of claim 9, wherein the via is filled with a metal selected from the group consisting of aluminum, aluminum alloys, copper, copper alloys, tantalum, tungsten, titanium and mixtures thereof.

13. The microelectronic device produced according to the process of claim 9.

* * * * *